(12) United States Patent
McQueen et al.

(10) Patent No.: US 6,806,123 B2
(45) Date of Patent: Oct. 19, 2004

(54) METHODS OF FORMING ISOLATION REGIONS ASSOCIATED WITH SEMICONDUCTOR CONSTRUCTIONS

(75) Inventors: Mark McQueen, Boise, ID (US); Luan C. Tran, Meridian, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/133,193

(22) Filed: Apr. 26, 2002

(65) Prior Publication Data

US 2003/0203564 A1 Oct. 30, 2003

(51) Int. Cl.⁷ .......................................... H01L 21/332
(52) U.S. Cl. ..................... 438/140; 438/454; 438/284; 257/394; 257/409; 257/340
(58) Field of Search ................................ 257/508, 390, 257/375–376, 394, 409, 340, 630; 438/231, 174, 194, 128–130, 289, 454, 140, 284

(56) References Cited

U.S. PATENT DOCUMENTS

| | | | | |
|---|---|---|---|---|
| 4,570,331 A | * | 2/1986 | Eaton et al. ................. | 438/241 |
| 4,686,000 A | * | 8/1987 | Heath .......................... | 438/702 |
| 4,937,756 A | * | 6/1990 | Hsu et al. ....................... | 716/5 |
| 5,164,806 A | * | 11/1992 | Nagatomo et al. ........... | 257/395 |
| 5,369,295 A | | 11/1994 | Vinal | |
| 5,397,909 A | | 3/1995 | Moslehi | |
| 5,635,744 A | * | 6/1997 | Hidaka et al. ............... | 257/349 |
| 5,654,573 A | * | 8/1997 | Oashi et al. ................. | 257/349 |
| 5,672,526 A | * | 9/1997 | Kawamura ................... | 438/294 |
| 5,814,875 A | * | 9/1998 | Kumazaki .................... | 257/488 |
| 5,866,934 A | | 2/1999 | Kadosh et al. | |
| 5,893,728 A | * | 4/1999 | Hidaka ........................ | 438/155 |
| 5,923,975 A | | 7/1999 | Rolandi | |
| 5,930,614 A | * | 7/1999 | Eimori et al. ................ | 438/211 |
| 6,060,364 A | * | 5/2000 | Maszara et al. ............. | 438/305 |
| 6,194,276 B1 | * | 2/2001 | Chan et al. .................. | 438/294 |
| 6,204,536 B1 | * | 3/2001 | Maeda et al. ................ | 257/355 |
| 6,277,720 B1 | | 8/2001 | Doshi et al. | |
| 6,359,319 B1 | * | 3/2002 | Noda .......................... | 257/380 |
| 6,362,034 B1 | | 3/2002 | Sandford et al. | |
| 6,380,598 B1 | * | 4/2002 | Chan .......................... | 257/390 |
| 6,429,079 B1 | * | 8/2002 | Maeda et al. ................ | 438/281 |
| 6,436,747 B1 | | 8/2002 | Segawa et al. | |

(List continued on next page.)

FOREIGN PATENT DOCUMENTS

EP        0718881        *  6/1996    ......... H01L/21/765

OTHER PUBLICATIONS

U.S. patent application Ser. No. 09/721,697, Dennison, C., filed Nov. 27, 2000.

(List continued on next page.)

*Primary Examiner*—Long Pham
*Assistant Examiner*—Thao X. Le
(74) *Attorney, Agent, or Firm*—Wells St. John P.S.

(57) ABSTRACT

The invention includes a DRAM array having a structure therein which includes a first material separated from a second material by an intervening insulative material. The first material is doped to at least $1\times10^{17}$ atoms/cm³ with n-type and p-type dopant. The invention also includes a semiconductor construction in which a doped material is over a segment of a substrate. The doped material has a first type majority dopant therein, and is electrically connected with an electrical ground. A pair of conductively-doped diffusion regions are adjacent the segment, and spaced from one another by at least a portion of the segment. The conductively-doped diffusion regions have a second type majority dopant therein. The invention also encompasses methods of forming semiconductor constructions.

14 Claims, 6 Drawing Sheets

U.S. PATENT DOCUMENTS

| | | | |
|---|---|---|---|
| 6,451,704 B1 | | 9/2002 | Pradeep et al. |
| 6,468,865 B1 | | 10/2002 | Yang et al. |
| 6,479,330 B2 | * | 11/2002 | Iwamatsu et al. ........... 438/151 |
| 6,492,694 B2 | | 12/2002 | Noble et al. |
| 6,515,899 B1 | * | 2/2003 | Tu et al. ................ 365/185.05 |
| 6,521,487 B1 | | 2/2003 | Chen et al. |
| 6,586,803 B2 | * | 7/2003 | Hidaka et al. .............. 257/347 |
| 6,607,979 B1 | * | 8/2003 | Kamiyama ................. 438/653 |
| 2002/0164846 A1 | * | 11/2002 | Lin et al. .................... 438/197 |
| 2003/0071310 A1 | * | 4/2003 | Salling et al. ............. 257/355 |

OTHER PUBLICATIONS

"Session 18: Integrated Circuits and Manufacturing—DRAM and Embedded DRAM Technology", 2001 IEDM Technical Program, 2001 IEEE International Electron Devices Meeting, Dec. 4, 2001, reprinted Nov. 15, 2001 from http://www.his.com/~iedm/techprogram/sessions/s18.html., pp. 1–2.

* cited by examiner

_FIG. 11_

_FIG. 12_

METHODS OF FORMING ISOLATION REGIONS ASSOCIATED WITH SEMICONDUCTOR CONSTRUCTIONS

TECHNICAL FIELD

The invention pertains to semiconductor constructions and methods of forming semiconductor constructions. In particular aspects, the invention pertains to isolation region constructions which can be utilized for, for example, electrically isolating transistor constructions from one another.

BACKGROUND OF THE INVENTION

Electrical isolation is commonly utilized in semiconductor constructions to alleviate, or prevent, leakage between electrical devices. For instance, it is frequently desired in dynamic random access memory (DRAM) fabrication to avoid sub-threshold leakage between access devices (such as, for example, access transistor constructions). There can be several facets which influence leakage currents between field effect transistor devices, including, for example, junction leakage in source/drain regions; drain-induced barrier lowering (DIBL) due to short gate lengths; gate-induced drain leakage (GIDL) due to high electric fields in a gate overlap region; narrow-width effects; and stress-induced leakage current (SILC) due to a proximity of an isolation region to a device.

A ratio of $I_{on}$ (drive current) to $I_{off}$ (sub-threshold leakage) can be utilized as a figure of merit for determining if access devices are performing adequately. It is found that reducing gate oxide thickness of access devices can improve a sub-threshold behavior of the devices while simultaneously increasing a drive current. However, a threshold voltage of a device reduces with the decrease in gate oxide thickness. Increasing dopant levels in channels of the devices can increase the threshold voltage to an acceptable level and compensate for the reduction in gate oxide thickness, but can increase junction leakage in source/drain regions. Additionally, the increased dopant level in a channel of a device can adversely cause junction capacitance to increase, and reduce the current drive of the device.

It would be desirable to develop new methods for reducing sub-threshold leakage of devices. It would be further desirable if such new methods avoided increasing dopant concentration in channel regions of access devices. Additionally, it would be desirable if such new methods could be utilized for forming structures suitable for electrical isolation in an integrated circuit construction.

SUMMARY OF THE INVENTION

In one aspect, the invention encompasses a semiconductor construction which includes a gate layer over a segment of a substrate. The segment can be considered a channel region. The gate layer has a first type majority dopant therein. A pair of conductively-doped diffusion regions are within the substrate adjacent the channel region, and spaced from one another by the channel region. The conductively-doped diffusion regions have a second type majority dopant therein. The majority dopant of the conductively-doped diffusion regions is opposite to the majority dopant of the gate layer. In other words, one of the first and second type dopants is n-type, and the other is p-type. The gate layer can, in particular applications, be electrically connected to a ground associated with the substrate.

In one aspect, the invention encompasses a DRAM array having one or more structures therein which include a gate layer separated from a silicon-containing substrate by an intervening insulative material. The gate layer is doped to at least $1 \times 10^{17}$ atoms/cm$^3$ with n-type dopant and is also doped to at least $1 \times 10^{17}$ atoms/cm$^3$ with p-type dopant.

The invention also encompasses methods of forming semiconductor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
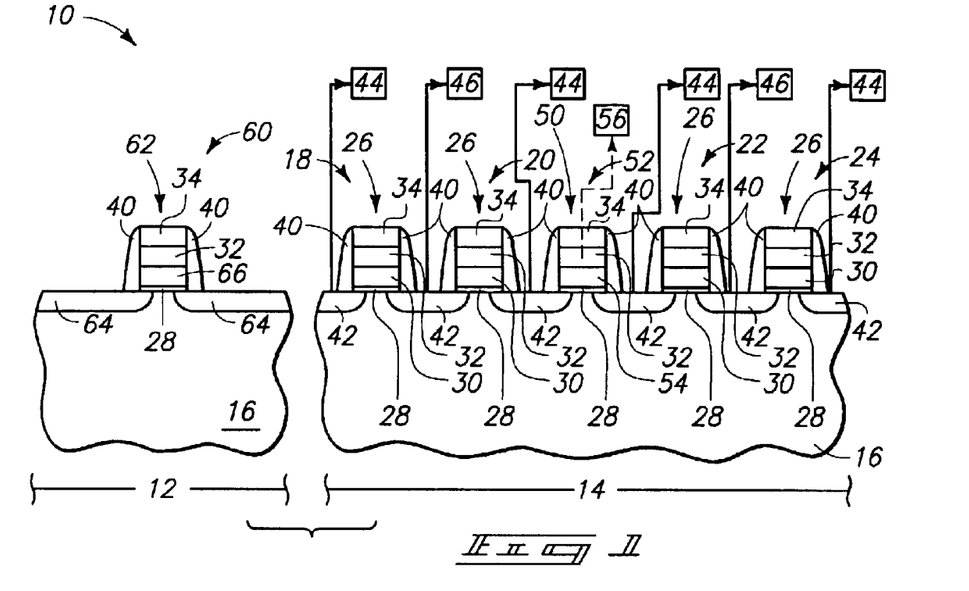
FIG. 1 is a diagrammatic, cross-sectional view of a pair of fragments of a semiconductor wafer construction which can be formed in particular embodiments of the present invention.

FIG. 1 illustrates a semiconductor construction 10 encompassed by particular aspects of the present invention. Construction 10 includes a pair of fragments 12 and 14. Fragments 12 and 14 comprise a substrate 16 which can comprise, consist essentially of, or consist of monocrystalline silicon, and such monocrystalline silicon can be lightly-doped with one or more suitable dopants. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In particular aspects, fragment 14 can correspond to a DRAM array, and fragment 12 can correspond to a portion of a wafer construction peripheral to the DRAM array.

Referring initially to fragment 14, such comprises a plurality of field effect transistor devices 18, 20, 22 and 24 supported by substrate 16, and also comprises a device 52 having a different threshold voltage than devices 18, 20, 22 and 24. Device 52 can be utilized for electrically isolating devices 20 and 22 from one another, as discussed below.

Each of devices 18, 20, 22 and 24 comprises a transistor gate stack 26 which includes an insulative material 28, a conductively-doped semiconductor material 30 (also referred to as a gate layer), an electrically conductive mass 32, and an insulative cap 34.

Insulative material 28 can comprise, for example, one or more of silicon nitride, silicon dioxide and silicon oxynitride. Insulative material 28 typically comprises silicon dioxide, and can be referred to as gate oxide.

Conductively-doped material 30 can comprise, for example, conductively-doped silicon. The silicon is typically in an amorphous and/or polycrystalline form. The dopant can comprise n-type dopant (such as, for example, phosphorous or arsenic), or can comprise p-type dopant (such as, for example, boron).

Conductive mass 32 will typically comprise a layer of silicide formed directly on an upper surface of a silicon material 30; or a layer of metal formed directly on (i.e., physically against) a barrier layer of $WN_x$ or TiN, which in turn is on the silicon material 30.

Insulative cap 34 can comprise, for example, one or both of silicon nitride and silicon dioxide.

The gate stacks comprise sidewalls, and electrically insulative spacers 40 are formed along such sidewalls. Spacers 40 can comprise, for example, silicon nitride, and can be formed by depositing a material conformally over substrate 16 and gate stacks 26, and subsequently anisotropically etching such material.

A plurality of source/drain regions 42 are provided within substrate 16 and between gate stacks 26. The gate stacks 26 can be considered as being directly over segments of substrate 16, and source/drain regions 42 can be considered as being spaced from one another by at least portions of such segments. In the shown constructions, source/drain regions 42 extend partially under gate stacks 26.

Source/drain regions 42 are conductively-doped diffusion regions extending into substrate 16. Typically, each of transistor constructions 18, 20, 22 and 24 will be an NMOS transistor, and accordingly source/drain regions 42 will be n-type doped diffusion regions. In other words, the majority dopant within regions 42 will be n-type dopant. The term "majority dopant" refers to the dopant that is most abundant within the regions. Accordingly, if both p-type dopant and n-type dopant are present in the regions, the majority dopant type will be that which is most prevalent. Additionally, it is noted that a stack 52 (discussed in more detail below) provided between stacks 26 can be incorporated into an NMOS transistor if a sufficient threshold voltage is provided.

The source/drain regions 42 extend under spacers 40 in the shown construction. It is to be understood, however, that other structures can be formed in which the source/drain regions do not extend underneath the spacers, or even in which at least some of the spacers are eliminated.

The various source/drain regions are connected to either capacitor constructions 44 or digit lines 46 to define various memory cell units of the DRAM memory array.

An isolation region 50 extends between transistor constructions 20 and 22, and can be utilized to electrically isolate such transistor constructions from one another. Isolation region 50 comprises the stack 52 similar to the stacks 26 of gate constructions 18, 20, 22 and 24. Stack 52 comprises the insulative material 28, conductive mass 32, and insulative cap 34 utilized in gate stacks 26. However, stack 52 differs from the gate stacks in having a heavily doped material 54 which is differently doped than the material 30 of stacks 26.

In particular aspects, material 54 can comprise silicon doped with significant concentrations of an opposite type dopant as that primarily utilized in source/drain regions 42. For instance, if source/drain regions 42 primarily comprise n-type dopant, material 54 can primarily comprise p-type dopant. The utilization of p-type dopant as a majority dopant within doped gate layer 54, while having source/drain regions 42 with n-type dopant as majority dopant, can cause stack 52 to have a high threshold voltage relative to adjacent devices. This can enable stack 52 to function primarily as an isolation region at particular threshold voltages utilized to drive adjacent devices, rather than as a transistor construction.

In some aspects of the invention material 54 can comprise significant concentrations of both p-type and n-type dopant, and can, for example, comprise concentrations of from $1 \times 10^{18}$ atoms/cm$^3$ to $5 \times 10^{21}$ atoms/cm$^3$ of both p-type and n-type dopants. Typically a concentration of the dopants is about $1 \times 10^{20}$ atoms/cm$^3$.

If stack 52 is utilized as an isolation region, it can be described as an isolation region having a mass 54 of material extending between a pair of adjacent source/drain regions 42. Further, the adjacent source/drain regions can, as shown, extend under the gate electrode (i.e., can extend under mass 54).

Stack 52 is shown having conductive layer 32 in contact with other electrical circuitry 56. In embodiments in which stack 52 is utilized as an isolation region, the other circuitry 56 can be an electrical ground associated with construction 10, or can be slightly positive or negative relative to ground as long as device 52 does not turn on an underlying channel.

It is noted that stack 52 can be utilized for other applications besides an isolation, region, and in such other applications electrical circuitry 56 can be at an electrical potential other than ground and configured to turn on the channel under device 52.

As a result of the dopant variation within layer 54 (relative to the layers 30 of gate stacks 26) the apparent or effective thickness of gate oxide 28 within stack 52 can change relative to that of stacks 26. In other words, even though gate oxide 28 has the same physical thickness in stacks 26 and stack 52, the effective electrical thickness of the gate oxide will be increased in stack 52 relative to stacks 26. Various alterations in stack 52 can be utilized to enhance the effect on the electrical thickness of oxide 28, including, for example, dopant depletion in the silicon layer 54 close to or at a gate oxide 28/silicon layer 54 interface; a change in the insulative material 28 to alter a dielectric constant of such material; and/or quantization in an inversion layer close to a gate oxide 28/silicon 54 interface. Dopant variation within layer 54 can also soften gate induced drain leakage effects relative to source/drain regions proximate layer 54.

In particular aspects of the present invention, there is an effective dopant depletion relative to an interface between gate oxide 28 and silicon layer 54. Specifically, silicon layer 54 has a lower effective concentration of n-type dopant than do the silicon layers 30. Such can be accomplished by initially providing layer 54 to have the same n-type dopant concentration as do layers 30, and then subsequently adding sufficient p-type dopant to layer 54 to alter electrical properties of layer 54. The p-type dopant concentration can be sufficient to overwhelm the n-type dopant concentration (i.e., to form the p-type dopant as the majority dopant in layer 54), or alternatively can be sufficient simply to have a measurable effect on the work function of a transistor construction comprising stack 52.

The alteration of layer 54 relative to layers 30 can render a device comprising stack 52 to be a special device relative to the devices comprising stacks 26. In particular aspects, such special device can be utilized as an electrical insulator between adjacent stacks. In other aspects, such special device can be utilized to drive capacitors or other electrical components under particular operating conditions.

A possible mechanism by which dopant depletion in a silicon-containing layer 54 can alter a work function of a device incorporating stack 52 is as follows. First, it is noted that various heat steps can be utilized to activate dopants and form degenerately-doped polysilicon films (with the term "degenerately-doped" referring to a fermi level close to or inside of a conduction band of silicon for n-type doped silicon). If the silicon layer is less than degenerately-doped, low frequency CV characteristics can occur with reduced gate capacitance (i.e., less than maximum oxide capacitance) when the gate is biased positive. This can be caused by depletion of majority carriers (electrons) near a silicon/gate oxide interface. Such depletion of carriers can be considered to be electrically equivalent to creation of a resistive layer at the interface, or in other words, an increase in gate oxide thickness. The mechanism is provided herein to assist the reader in understanding the invention, and is not to be construed as limiting the claims except to the extent, if any, that the mechanism is expressly recited in the claims.

Referring next to the fragment 12 of construction 10, such comprises a transistor structure 60 which includes a gate stack 62 and source/drain regions 64. Gate stack 62 comprises gate oxide 28, conductive mass 32, insulative cap 34, and sidewall spacers 40. Insulative material 28, conductive mass 32, and insulative cap 34 can be identical to the structures having the same numeric labels described with reference to fragment 14. Additionally, gate 62 comprises a conductively-doped material 66, which can be, for example, either n-type or p-type-doped silicon. In particular aspects, construction 60 can comprise a layer 66 which is majority-doped with p-type dopant, and source/drain regions 64 can also comprise p-type dopant as a majority dopant.

In particular aspects of the invention, a difference between stack 52, and stacks 18, 20, 22, 24 and 62 of fragments 12 and 14 can be that stack 52 is an isolation region in which conductive material 32 and conductively-doped silicon 54 are electrically connected to ground. In such applications, another distinction can be that stack 52 comprises a conductively-doped material 54 (typically silicon) which has a different type majority dopant than do the source/drain regions 42 immediately adjacent stack 52. For instance, source/drain regions 42 can comprise n-type dopant as a majority dopant, and material 54 can comprise p-type dopant as a majority dopant. Such would be a typical arrangement in applications in which stack 52 is utilized as an isolation structure formed within a DRAM array. It should be understood, however, that the invention can also encompass applications in which the majority dopant of source/drain regions 42 is p-type and the majority dopant of material 54 is n-type. The arrangement in which source/drain regions 42 are p-type and material 54 is majority doped with n-type dopant can be utilized in constructions in which stack 52 is incorporated as part of a transistor construction.

In various applications, material 54 can comprise essentially one type of dopant (i.e., at least 99% of the dopant within material 54 can be either n-type or p-type) or material 54 can effectively comprise two types of dopant (in other words, less than 99% of the dopant within material 54 is either n-type or p-type). In particular applications, material 54 can be doped with p-type dopant and be utilized as an isolation region in a DRAM array.

In the shown construction, material 54 is physically against insulative mass 28, and conductive mass 32 is physically against material 54. Further, conductive mass 32 can comprise a silicide layer which is formed directly on (physically against) layer 52, and can further comprise a metal layer, metal compound layer, and/or metal alloy layer which is formed over and physically against the silicide layer.

Stack 52 can be considered to be within a DRAM array, and the array can be, for example, from $4F^2$ to $8F^2$.

A method of forming the construction of FIG. 1 is described with reference to FIGS. 2-6. In describing FIGS. 2-6, similar numbering will be used as was utilized above in describing FIG. 1, as appropriate.

Figure 2:
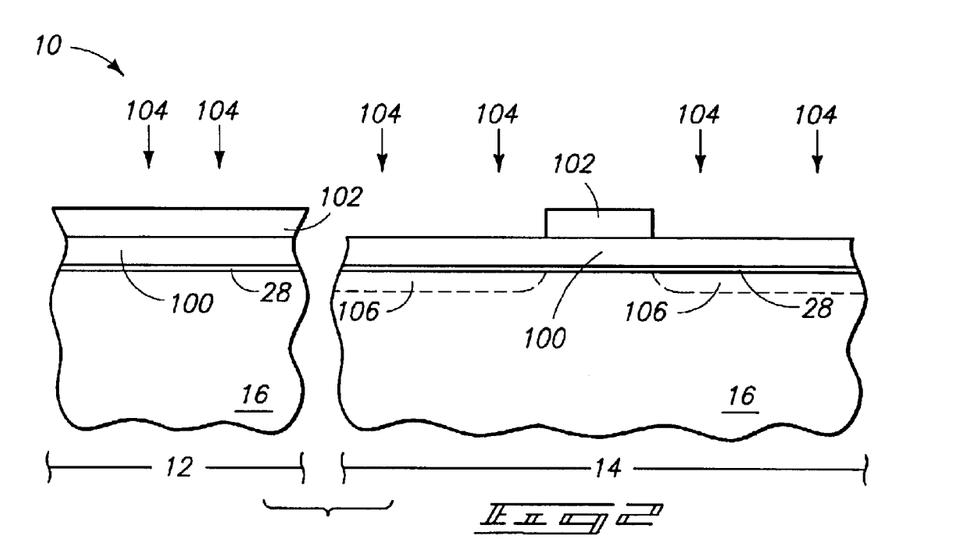
FIG. 2 is a diagrammatic, cross-sectional view of a pair of fragments of a semiconductor wafer construction at a preliminary stage of a fabrication sequence which can be utilized in forming the FIG. 1 structures.

Referring initially to FIG. 2, wafer construction 10 is shown at a preliminary processing stage. Construction 10 comprises substrate 16, insulative layer 28, and a mass 100. Mass 100 can be undoped as initially deposited, or alternatively can be in situ doped. In the shown application, mass 100 is undoped, and accordingly has not acquired the properties of either mass 66 (FIG. 1), mass 30 (FIG. 1), or mass 54 (FIG. 1).

A masking material 102 is formed over mass 100, and such blocks portions of mass 100. Masking material 102 can comprise, for example, photoresist; and can be patterned utilizing suitable photolithographic processes.

A dopant 104 is implanted relative to construction 10, and forms threshold voltage implant regions 106 for a DRAM array which will ultimately be formed relative to fragment 14. Masking layer 102 prevents the dopant from being implanted into the blocked regions of fragment 12 and 14. The blocked region of fragment 14 corresponds to a region where stack 52 (FIG. 1) is ultimately to be formed. It is to be understood, however, that in other various applications of the invention some or all of the shown portions of masking material 102 can be eliminated. In such applications, the threshold voltage implant can extend across an entirety of fragment 14 and/or can extend across a portion or an entirety of fragment 12.

Figure 3:
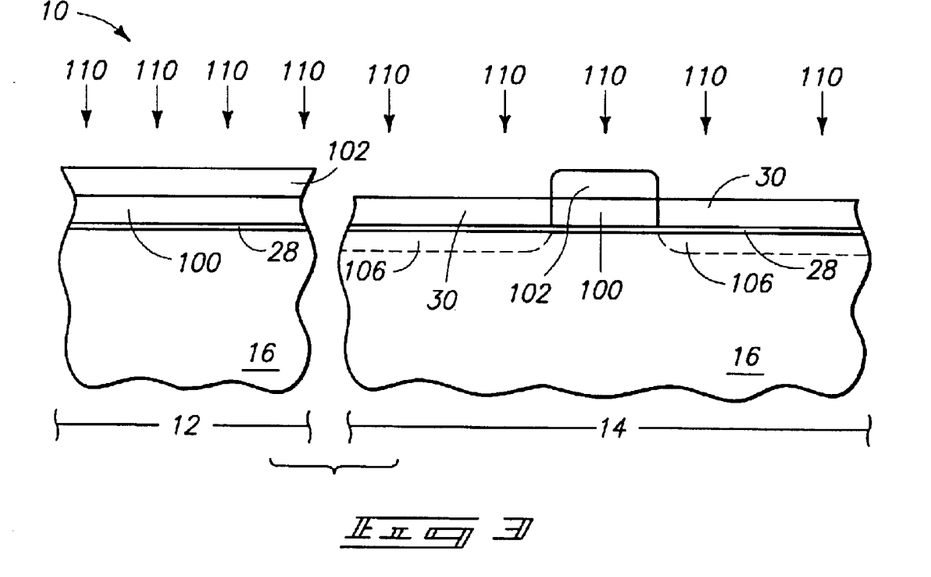
FIG. 3 is a view of the FIG. 2 wafer fragments shown at a processing stage subsequent to that of FIG. 2.

Referring to FIG. 3, a second dopant 110 is implanted into exposed portions of mass 100 to convert such exposed portions to doped material 30. Dopant 110 can comprise, for example, n-type dopant (such as phosphorous or arsenic). Dopant 110 can be provided to a concentration of at least $1 \times 10^{20}$ atoms/cm$^3$, and typically is provided to a concentration of from about $1 \times 10^{20}$ atoms/cm$^3$ to about $5 \times 10^{21}$ atoms/cm$^3$. In applications in which masking material 102 is not utilized during formation of threshold voltage implants 106 (the stage shown with reference to FIG. 2), the masking material would typically still be provided prior to the shown processing of FIG. 3 to block at least some of fragment 12, as well as blocking a portion of fragment 14 where stack 52 (FIG. 1) is ultimately to be formed.

Figure 4:
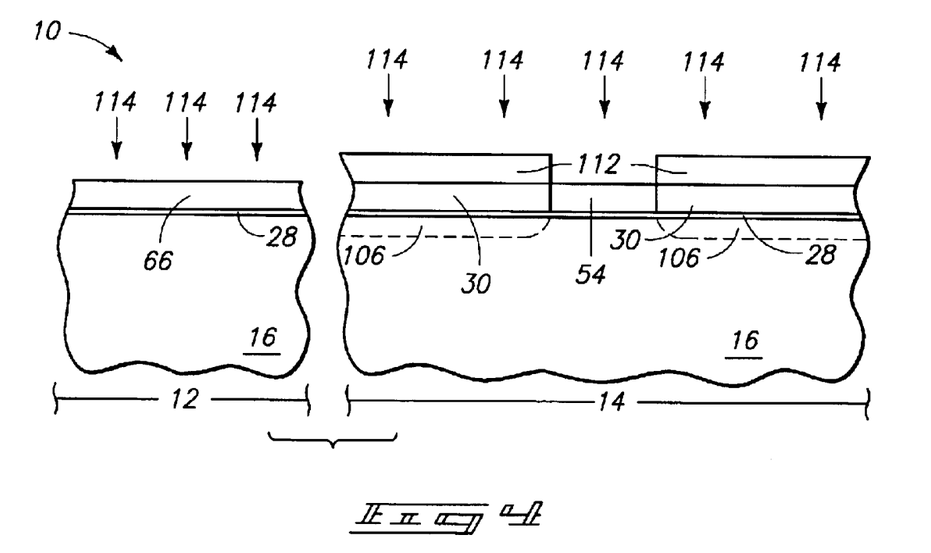
FIG. 4 is a view of the FIG. 2 fragments shown at a processing stage subsequent to that of FIG. 3.

Referring to FIG. 4, masking material 102 (FIG. 3) is removed and replaced by another patterned masking material 112. Masking material 112 can comprise, for example, photoresist, and can be formed into the shown pattern by, for example, photolithographic processing. Masking material 112 covers some portions of fragment 14 while leaving a portion where stack 52 is ultimately to be formed uncovered; and leaves the shown portion of fragment 12 uncovered.

A dopant 114 is implanted into construction 10, and specifically is implanted into portions of material 100 (FIG. 3) which are not covered by mask 112. Such converts the material to material 66 relative to fragment 12, and to material 54 relative to fragment 14. Dopant 114 can comprise an opposite conductivity type relative to dopant 110. Accordingly, if dopant 110 is n-type, dopant 114 can be p-type. Further, dopant 114 can be implanted to a concentration comparable to that of dopant 110 (specifically, to a concentration greater than $1 \times 10^{20}$ atoms/cm$^3$).

In particular applications, mask 102 (FIG. 3) can be eliminated, and dopant 110 implanted into an entirety of material 100 (FIG. 2). Subsequently, mask 112 can be formed and dopant 114 implanted at a concentration higher than that of dopant 110. The dopant 114 can then effectively overwhelm the dopant 110 within exposed (unblocked) regions of fragments 12 and 14 to form the doped materials 54 and 66.

In particular applications, the portion of fragment 12 exposed to dopant 114 corresponds to a region where a gate of a PMOS transistor will be formed, and the exposed portion of material 100 (FIG. 2) in fragment 14 corresponds to a portion where an isolation structure 52 (FIG. 1) will ultimately be formed. Accordingly, dopant 114 can be simultaneously implanted into a portion of the stack corresponding to an isolation structure to be formed within a DRAM array and a portion of the gate stack corresponding to a PMOS transistor in a region peripheral to the DRAM array.

Figure 5:
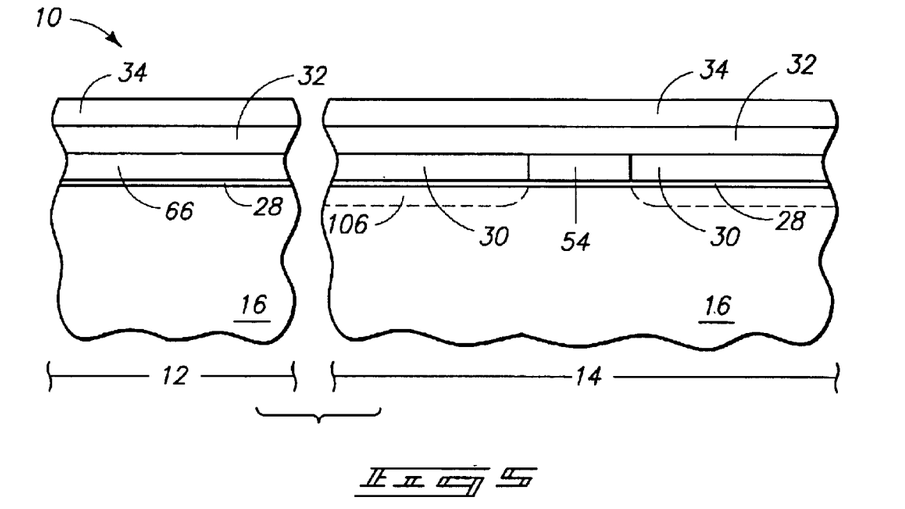
FIG. 5 is a view of the FIG. 2 fragments shown at a processing stage subsequent to that of FIG. 4.

Referring to FIG. 5, layers 32 and 34 are formed across fragments 12 and 14. As discussed above, layer 32 can comprise silicide, metal, metal compounds and/or metal alloys; and layer 34 can comprise an insulative material, such as, for example, silicon dioxide and/or silicon nitride.

Figure 6:
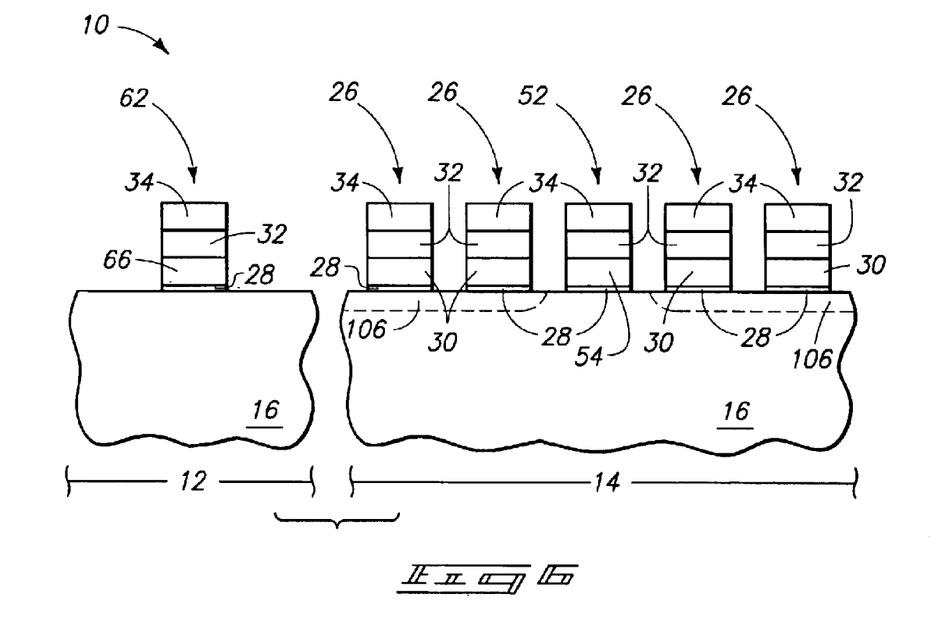
FIG. 6 is a view of the FIG. 2 fragments shown at a processing stage subsequent to that of FIG. 5.

Referring to FIG. 6, stacks 26, 52 and 62 are patterned from the layers 28, 30, 32, 34, 54 and 66 of FIG. 5. Such patterning can be accomplished by, for example, forming a patterned photoresist mask (not shown) over the layers, and subsequently transferring a pattern from the mask through the layers utilizing suitable etching conditions.

The stacks 26, 52 and 62 can be incorporated into the constructions of FIG. 1 by forming source/drain regions 42 and 64 (shown in FIG. 1) within substrate 16, and by forming the sidewall spacers 40 (shown in FIG. 1).

In particular aspects of the invention, the silicon mass 66 in peripheral array 12 can be more heavily doped than the material 30 of the stacks 26 within DRAM array 14. Further, the peripheral region can be doped simultaneously with various processing occurring in the array region in addition to, or alternatively to, that shown. For instance, the silicon 66 can be doped during implant of a threshold voltage adjust in the array.

Another application of the invention is described with reference to FIGS. 7-12. In referring to FIGS. 7-12, the DRAM array fragment (fragment 14 of FIGS. 1-6) is the only portion of construction 10 which is illustrated. Similar numbering will be utilized in describing FIGS. 7-12 as was used above in describing FIGS. 1-6, where appropriate.

Figure 7:
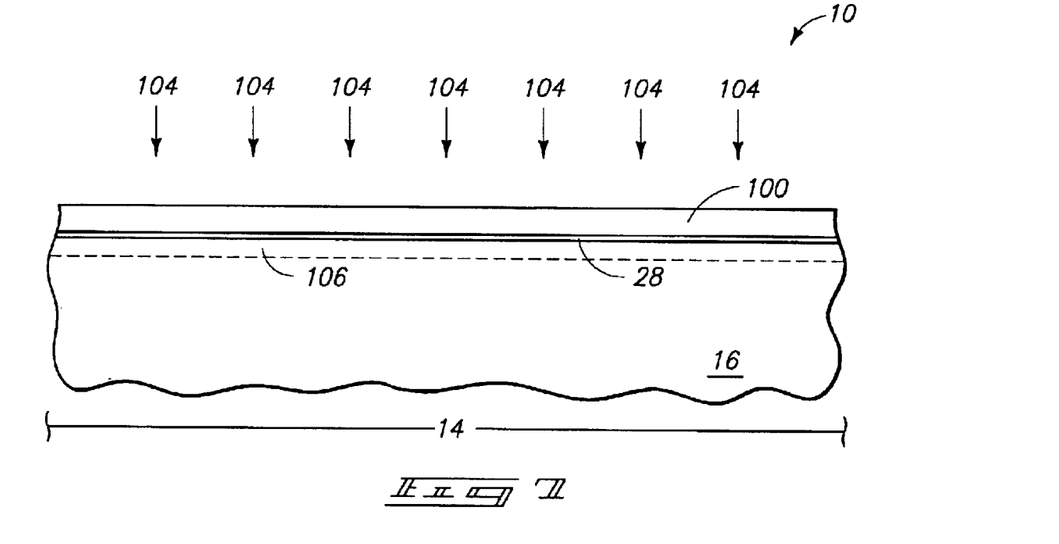
FIG. 7 is a diagrammatic, cross-sectional view of a semiconductor wafer fragment shown at a preliminary step of another processing sequence encompassed by particular aspects of the present invention.

Referring initially to FIG. 7, fragment 14 is illustrated at a preliminary stage. The fragment comprises semiconductor substrate 16, having insulative material layer 28 and material 100 formed thereover. A first dopant 104 is implanted through layers 28 and 100, and forms a threshold voltage implant 106 within substrate 16. Dopant 104 can comprise, for example, boron, indium, BF$_2$, and/or B$_{10}$H; and can be formed to a concentration of, for example, from $5 \times 10^{16}$ atoms/cm$^3$ to $1 \times 10^{18}$ atoms/cm$^3$ within threshold voltage region 106.

Figure 8:
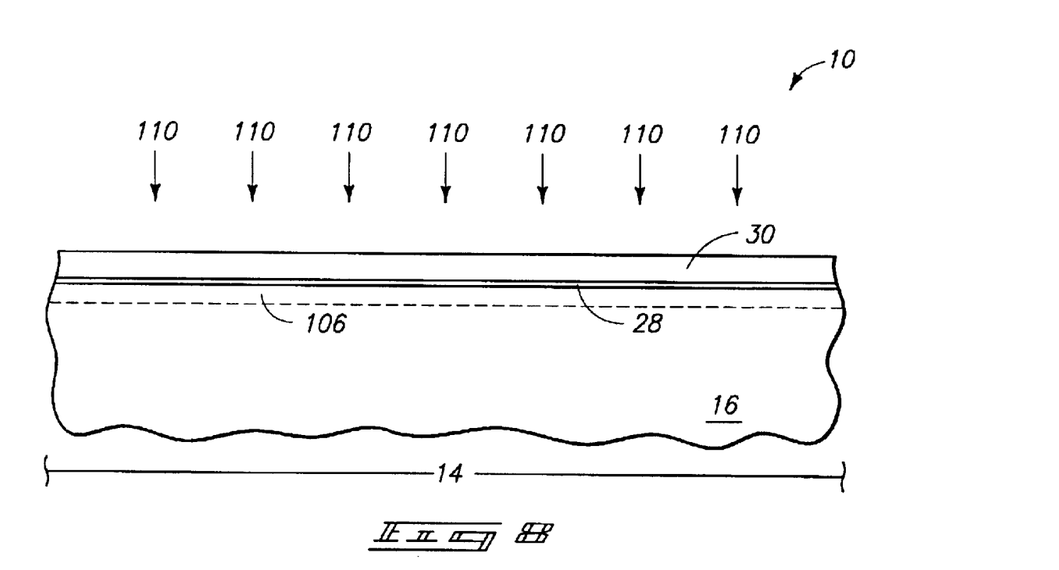
FIG. 8 is a view of the FIG. 7 fragment shown at a processing step subsequent to that of FIG. 7.

Referring to FIG. 8, a second dopant 110 is implanted into the material 100 (FIG. 7) to convert the material into a doped material 30. Second dopant 110 can comprise, for example, n-type dopant. It is noted that the order of implant of dopants 104 and 110 can be reversed from the order shown. It is also noted the material can be initially formed to be situ doped, and the processing of FIG. 8 omitted.

Figure 9:
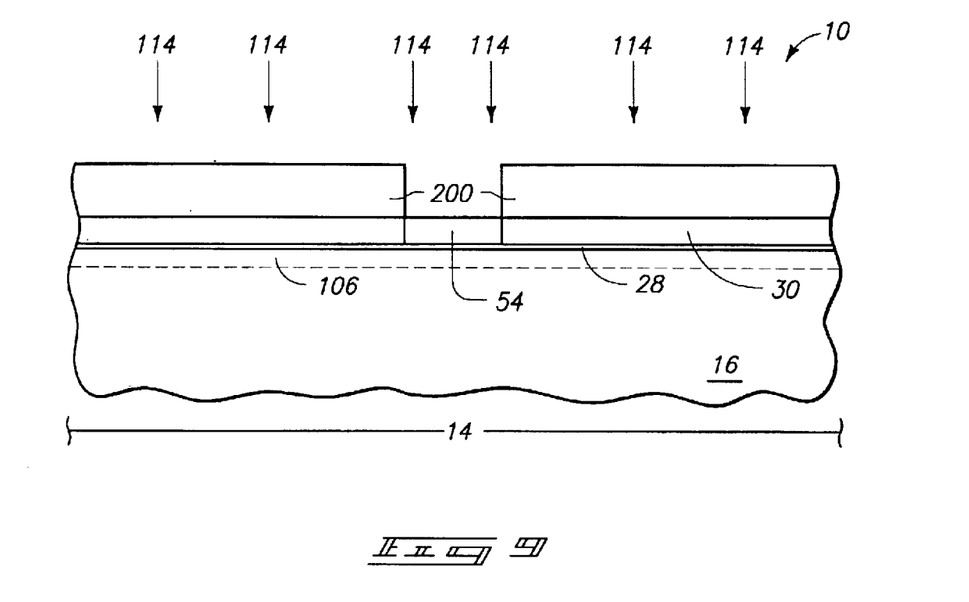
FIG. 9 is a view of the FIG. 7 fragment shown at a processing step subsequent to that of FIG. 8.

Referring to FIG. 9, a masking material 200 is formed over doped material 30 and patterned to leave a portion of material 30 exposed. Subsequently, a dopant 114 is implanted into construction 10, and specifically into the exposed portion of the material to convert the material to a portion 54 having a different dopant composition than does the remainder of the doped material. Dopant 114 can comprise, for example, p-type dopant, and can be implanted to a concentration sufficient to cause material 54 to have measurably different electrical performance aspects than do other portions of material 30. Dopant 114 can, in other words, have an opposite conductivity type than does the dopant 110 initially provided within the doped material. Accordingly, if dopant 110 comprises n-type dopant, then dopant 114 can comprise p-type dopant, and vice versa. Dopant 114 can be provided to a suitable concentration to overwhelm the initially provided dopant 110, and accordingly to change the majority dopant within region 54 to be different than the majority dopant within the other portions of doped material 30.

Figure 10:
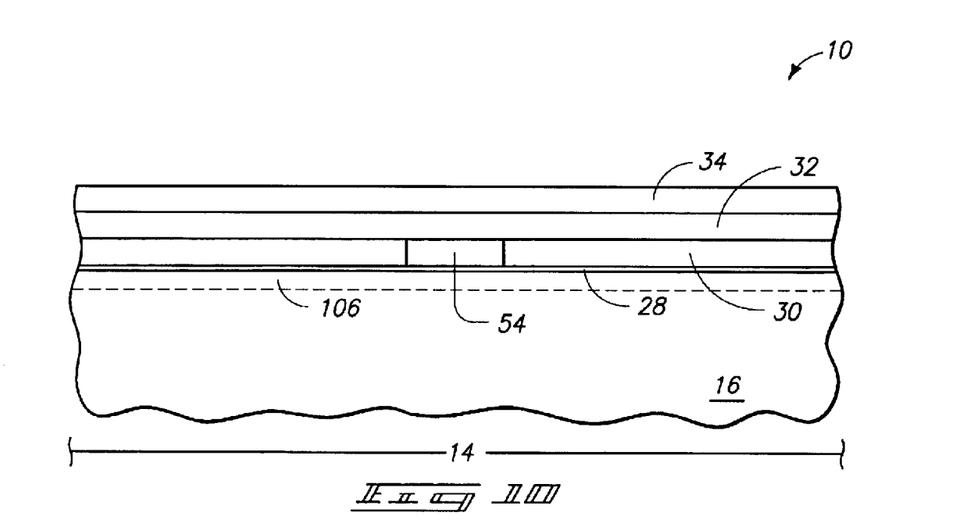
FIG. 10 is a view of the FIG. 7 fragment shown at a processing step subsequent to that of FIG. 9.

Referring to FIG. 10, mask 200 (FIG. 9) is removed, and subsequently layers 32 and 34 are formed.

Figure 11:
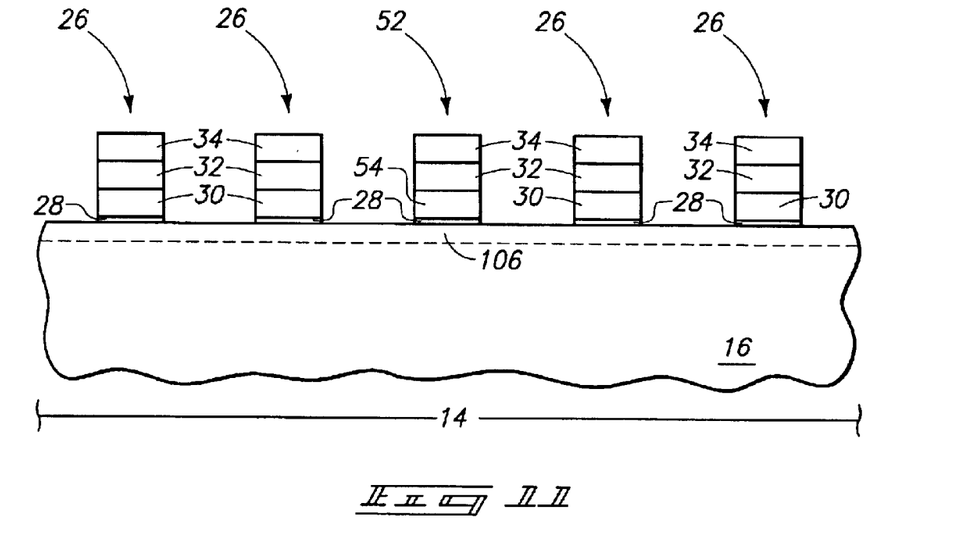
FIG. 11 is a view of the FIG. 7 fragment shown at a processing step subsequent to that of FIG. 10.

Referring to FIG. 11, stacks 26 and 52 are patterned from layers 28, 30, 32, 34 and 54. Such patterning can be accomplished using similar processing to that described above with reference to FIG. 6.

Figure 12:
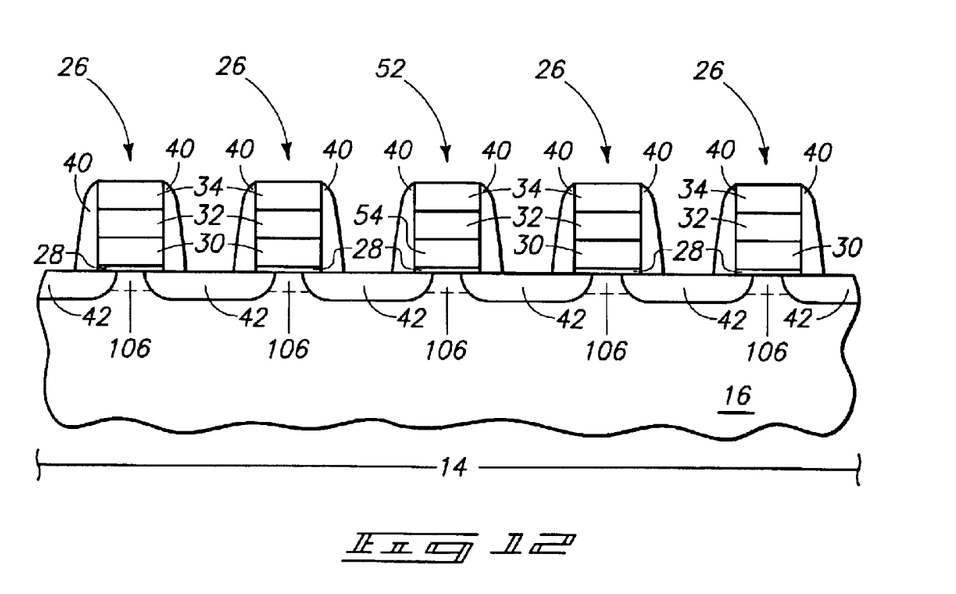
FIG. 12 is a view of the FIG. 7 fragment shown at a processing step subsequent to that of FIG. 11.

Referring to FIG. 12, source/drain regions 42 are formed, and spacers 40 are also formed. Subsequently, bitline contacts (not shown in FIG. 12) and capacitor contacts (not shown in FIG. 12) can be formed to complete the DRAM array construction illustrated in FIG. 1.

The inclusion of two types of dopant in mass 54 can create a significant shift in a threshold voltage of a device incorporating stack 52 relative to transistor devices incorporating stacks 26. A shift can be at least about 400 millivolts relative to a heavily doped silicon material (with heavily doped being a silicon having from $1 \times 10^{20}$ to about $1 \times 10^{21}$ atoms/cm$^3$). Even if there is an order of magnitude reduction in the amount of dopant in the silicon, the shift in the threshold voltage can be comparable. Further, even a relatively small amount of depletion (i.e. inclusion of p-type dopant in an otherwise n-type doped semiconductive layer) can significantly shift a threshold voltage of a device incorporating the layer. A small amount of depletion can be less than 10%, and in particular aspects being from about 5 to about 7%, with an exemplary depletion amount being about 6.5%.

There can be several advantages to utilization of methodology of the present invention as opposed to physically growing thicker gate oxides within various stacks of a DRAM array. For instance, the methodology of the present invention can enable sub-threshold characteristics of a device to be retained or improved while increasing electrical gate oxide thickness in an inversion region of the device. Further, less of a channel (threshold voltage-adjust) implant can be utilized to target a given threshold voltage for a device. Additionally, there can be an improvement in junction leakage characteristics on a storage node side of a device, or in other words, there can be an improved static refresh characteristic of the device.

It can be desirable to fabricate the stack 52 so that dopants do not reach an interface between material 54 and insulative material 28 to avoid what could otherwise be a large impact on refresh of devices incorporating stack 52.

In applications in which stack 52 is utilized solely as an isolation device, the counter-dopant level within material 54 can be provided by a boron implant with a dose of from $5 \times 10^{14}/cm^2$ to $5 \times 10^{15}/cm^2$ and energy of from 1 KeV to 4 keV. The boron implant can create depletion within material 54 which effectively increases an electrical gate oxide thickness associated with stack 52. It is possible that boron may flow through an oxide insulative material 28 and into an active area beneath stack 52. This could actually be a benefit, since it would allow an increase in a surface concentration of p-type dopant of an insulative structure associated with stack 52 without significant risk of the p-type dopant (for example boron) migrating to a storage node diode and causing increased diode leakage.

If the device 50 of FIG. 1 is utilized solely for an isolation device, and if doped material 54 has an opposite-type majority dopant relative to source/drain regions 42, a threshold voltage of the device can be increased by about 1 volt without implanting p-type dopant into a channel region beneath stack 52. If a threshold voltage difference between the device 50 and proximate devices is desired to be less than 1 volt, a partial channel implant can be provided for device 50 relative to full channel implants for the devices proximate device 50.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an isolation region associated with a semiconductor construction, comprising:
   providing a construction comprising a semiconductor substrate, an insulative material over the substrate, and a semiconductive material over the insulative material;
   masking a segment of the construction and leaving another segment of the construction unmasked, the masked segment defining an isolation region of the construction;
   doping a portion of the semiconductor substrate of the unmasked segment; and
   etching the semiconductive material of the construction to form at least two transistor gates, wherein one of the two transistor gates is directly over the isolation region and comprises the semiconductive material of the masked segment, and wherein the other of the two transistor gates is directly over the doped semiconductor substrate and comprises the semiconductive material of the unmasked segment.

2. The method of claim 1 further comprising doping portion of the semiconductive material of the unmasked segment.

3. The method of claim 2 wherein:
   the doped semiconductor substrate comprises a majority of first type dopant;
   the doped semiconductive material comprises a majority of second type dopant; and
   one of the first and second type dopants is n-type and the other is p-type.

4. The method of claim 2 further comprising doping a portion of the semiconductive material of the masked segment.

5. The method of claim 4 wherein:
   the doped semiconductive material of the masked segment comprises a majority of first type dopant;
   the doped semiconductive material of the unmasked segment comprises a majority of second type dopant; and
   one of the first and second type dopants is n-type and the other is p-type.

6. The method of claim 5 wherein the doped semiconductive material of the unmasked segment is initially doped with the first-type dopant and subsequently counter-doped with the second-type dopant.

7. The method of claim 6 wherein the initial doping of the semiconductive material of the unmasked segment comprises forming the semiconductive material of the construction to be in situ doped with the first-type dopant.

8. The method of claim 1 wherein the semiconductive substrate comprises monocrystalline silicon.

9. The method of claim 1 wherein the insulative material comprises silicon dioxide.

10. The method of claim 1 wherein the semiconductive material comprises polycrystalline silicon.

11. The method of claim 1 wherein the one transistor gate comprises a pair of opposing sidewalls and the method further comprises forming a pair of spacers along the opposing sidewalls and directly over a portion of the doped semiconductor substrate.

12. The method of claim 1 further comprising forming a silicide-comprising layer over the semiconductive material of the constructions, wherein the etching the semiconductive material further comprises etching the silicide-comprising layer, and wherein the two transistor gates further comprise the silicide of the silicide-comprising layer.

13. The method of claim 12 wherein the silicide-comprising layer comprises a layer of metal formed directly on a barrier layer, the barrier layer comprising one or both of $WN_x$ and TiN; and wherein the barrier layer is formed directly on an upper surface of the semiconductive material.

14. The method of claim 1 further comprising providing an electrical ground associated with the semiconductor substrate and electrically connecting the semiconductive material to the electrical ground.

* * * * *

UNITED STATES PATENT AND TRADEMARK OFFICE
CERTIFICATE OF CORRECTION

PATENT NO. : 6,806,123 B2
DATED : October 19, 2004
INVENTOR(S) : McQueen et al.

It is certified that error appears in the above-identified patent and that said Letters Patent is hereby corrected as shown below:

Column 4,
Line 42, please delete "isolation," after "an" and insert -- isolation --.

Column 8,
Line 10, please delete "situ" after "to be" and insert -- in-situ --.

Column 9,
Line 13, please delete "keV." before "The" and insert -- KeV. --.

Column 10,
Line 4, please insert -- a -- after "doping".

Signed and Sealed this

Second Day of August, 2005

JON W. DUDAS
*Director of the United States Patent and Trademark Office*